United States Patent
Kamuf

(10) Patent No.: US 9,571,129 B2
(45) Date of Patent: Feb. 14, 2017

(54) METHOD AND ARRANGEMENT FOR DECODING A SIGNAL ENCODED BY A TAIL-BITING CODE

(75) Inventor: Matthias Kamuf, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 1109 days.

(21) Appl. No.: 12/990,246

(22) PCT Filed: Apr. 8, 2009

(86) PCT No.: PCT/EP2009/054255
§ 371 (c)(1),
(2), (4) Date: Dec. 13, 2010

(87) PCT Pub. No.: WO2009/132945
PCT Pub. Date: Nov. 5, 2009

(65) Prior Publication Data
US 2011/0099455 A1    Apr. 28, 2011

Related U.S. Application Data

(60) Provisional application No. 61/053,699, filed on May 16, 2008.

(30) Foreign Application Priority Data

Apr. 30, 2008    (EP) ..................................... 08155454

(51) Int. Cl.
*H03M 13/39* (2006.01)
*H03M 13/37* (2006.01)
(Continued)

(52) U.S. Cl.
CPC ..... *H03M 13/3972* (2013.01); *H03M 13/3723* (2013.01); *H03M 13/3938* (2013.01);
(Continued)

(58) Field of Classification Search
CPC .................... H03M 13/3972; H03M 13/3723; H03M 13/3938
(Continued)

(56) References Cited

U.S. PATENT DOCUMENTS 5,349,589 A * 9/1994 Chennakeshu et al. ...... 714/795
5,497,384 A * 3/1996 Fredrickson et al. ........ 714/792
(Continued)

FOREIGN PATENT DOCUMENTS

WO          97/40583 A1    10/1997

OTHER PUBLICATIONS

Love, R. et al. "Downlink Control Channel Design for 3GPP LTE." IEEE Wireless Communications and Networking Conference (WCNC 2008), Mar. 31-Apr. 3, 2008, pp. 813-818.
(Continued)

*Primary Examiner* — Joseph D Torres
(74) *Attorney, Agent, or Firm* — Coats & Bennett, PLLC

(57) ABSTRACT

A method of decoding a signal that has been encoded by a tail-biting code based on at least one encoding parameter is disclosed. The at least one encoding parameter may be a trellis size or a quantity of aggregated encoding elements or a code rate. The method is suitable for use in a communication device and comprises receiving the signal, performing a first decoding attempt of the signal based on a first set of starting state metrics and a first encoding parameter hypothesis, the first decoding attempt resulting in a first set of ending state metrics. The method further comprises performing, if the first decoding attempt fails, a second decoding attempt of the signal based on a second set of starting state metrics based on the first set of ending state metrics and a second encoding parameter hypothesis different from the first encoding parameter hypothesis.

2 Claims, 3 Drawing Sheets

(51) Int. Cl.
*H03M 13/41* (2006.01)
*H03M 13/00* (2006.01)
*H04L 1/00* (2006.01)

(52) U.S. Cl.
CPC ..... *H03M 13/3955* (2013.01); *H03M 13/413* (2013.01); *H03M 13/6525* (2013.01); *H04L 1/0046* (2013.01); *H04L 1/0054* (2013.01)

(58) Field of Classification Search
USPC .......................................... 714/774, 794, 795
See application file for complete search history.

(56) References Cited

U.S. PATENT DOCUMENTS

| | | | |
|---|---|---|---|
| 5,878,098 A * | 3/1999 | Wang et al. | 375/377 |
| 5,887,007 A * | 3/1999 | Iwata et al. | 714/795 |
| 6,199,186 B1 | 3/2001 | Chen et al. | |
| 6,266,795 B1 * | 7/2001 | Wei | 714/755 |
| 6,351,832 B1 * | 2/2002 | Wei | 714/701 |
| 6,473,878 B1 * | 10/2002 | Wei | 714/755 |
| 6,477,679 B1 * | 11/2002 | Such et al. | 714/755 |
| 6,477,681 B1 * | 11/2002 | Taipale et al. | 714/795 |
| 6,718,502 B1 * | 4/2004 | Kuznetsov et al. | 714/755 |
| 7,729,237 B2 * | 6/2010 | Lee et al. | 370/208 |
| 7,782,749 B2 * | 8/2010 | Yu et al. | 370/204 |
| 7,856,591 B2 * | 12/2010 | Shi et al. | 714/795 |
| 8,116,366 B2 * | 2/2012 | Kawashima et al. | 375/233 |
| 8,219,896 B2 * | 7/2012 | Chen et al. | 714/795 |

OTHER PUBLICATIONS

Cox, R. V. et al. "An Efficient Adaptive Circular Viterbi Algorithm for Decoding Generalized Tailbiting Convolutional Codes." IEEE Transactions on Vehicular Technology, vol. 43, No. 1, Feb. 1, 1994, pp. 57-68.

Anderson, J. B. et al. "An Optimal Circular Viterbi Decoder for the Bounded Distance Criterion." IEEE Transactions on Communications, vol. 50, No. 11, Nov. 2002, pp. 1736-1742.

* cited by examiner

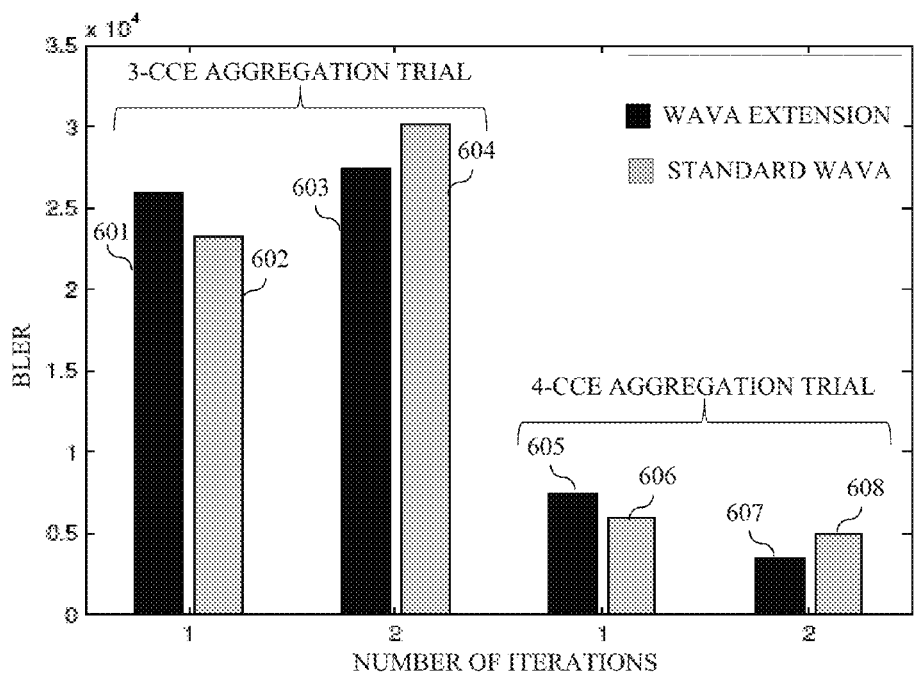
Fig. 6
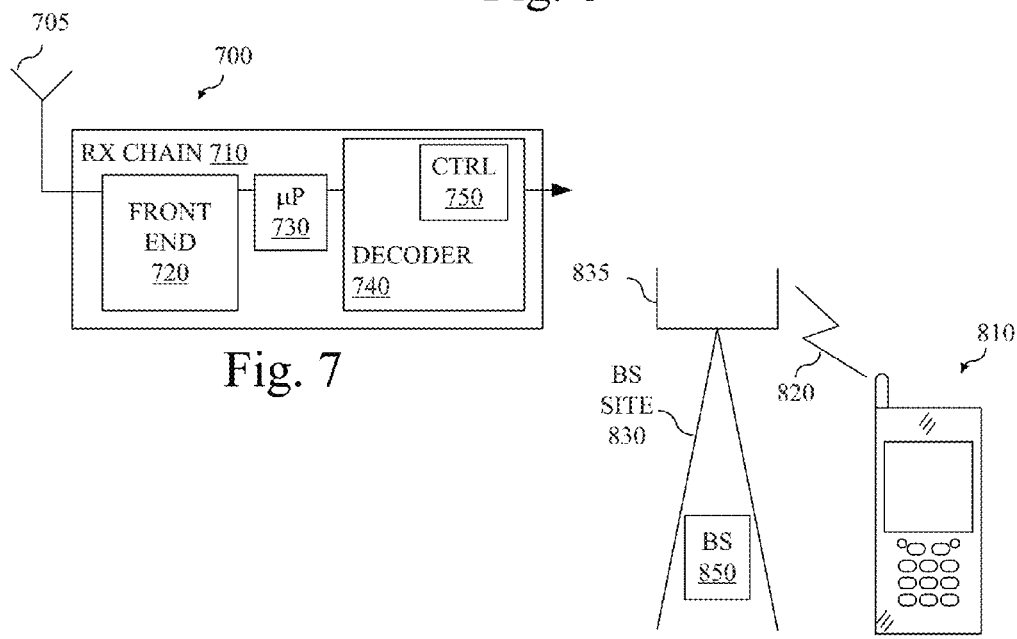
Fig. 7
Fig. 8

METHOD AND ARRANGEMENT FOR DECODING A SIGNAL ENCODED BY A TAIL-BITING CODE

TECHNICAL FIELD

The present invention relates generally to the field of decoding tail-biting codes. More particularly, it relates to the decoding of tail-biting codes when several hypotheses are evaluated in the decoding process.

BACKGROUND

In UMTS LTE (Universal Mobile Telecommunication Standard-Long Term Evolution), a standard currently under development and advocated by 3GPP ($3^{rd}$ Generation Partnership Project), it is proposed that downlink (DL) control information (DCI) be encoded by a rate ⅓ tail-biting (TB) convolutional code.

A tail-biting code imposes the tail-biting criterion, which forces the convolutional encoder to start and end in the same state. However, in contrast to the traditional use of a convolutional encoder, any state may be used as start and end states. In spite of the use of a convolutional encoder for implementation, a tail-biting code is, in fact, a block code. For feed forward encoders, such as the one used in UMTS LTE, the tail-biting criterion may be achieved by loading the registers of the encoder with the last m bits of the K-bit information block to be input to the encoder, where m is the encoder memory.

In UMTS LTE, the downlink control information is made up by an aggregation of control channel elements (CCE). The number of aggregated control channel elements is denoted s and belongs to an ensemble S. Each CCE is in turn made up by a number (X) of resource elements (RE), as specified in 3GPP TS 36.211 V8.2.0 (2008-03).

Various parameters of the encoding process, such as the number s and the length of the trellis associated with the tail-biting code, may not be known to the decoder. Therefore, the decoder needs to perform blind detection, i.e. test different hypotheses regarding the encoding parameters, to decode the information correctly. The number of hypotheses that need to be tested may be large. Thus, the decoding effort may be substantial.

Therefore, there is a need for improved methods and arrangements for decoding a signal encoded by a tail-biting code.

An overview of tail-biting codes may be found in H. H. Ma and J. K. Wolf, "On tail-biting convolutional codes," IEEE Trans. Commun., vol. 34, no. 2, pp. 104-111, February 1986.

Example algorithms suitable for decoding of tail-biting codes may be found in R. Y. Shao, S. Lin and M. P. Fossorier, "Two decoding algorithms for tail-biting codes," IEEE Trans. Commun., vol. 51, no. 10, pp. 1658-1665, October 2003, in J. B. Anderson and S. M. Hladik, "A circular Viterbi algorithm for the bounded distance criterion", IEEE Trans. Commun., vol. 50, no. 11, pp. 1736-1742, November 2002, and in J. B. Anderson and S. M. Hladik, "Tailbiting MAP decoders," IEEE J. Select. Areas Commun., vol. 16, no. 2, pp. 297-302, February 1998.

A UMTS LTE standard proposal regarding the downlink control information format may be found in R1-071683, Nokia, "Tree structure for the DL control channel," 3GPP RAN1#48bis, St. Julians, Malta, March 2007.

SUMMARY

It should be emphasized that the term "comprises/comprising" when used in this specification is taken to specify the presence of stated features, integers, steps, or components, but does not preclude the presence or addition of one or more other features, integers, steps, components, or groups thereof.

It is an object of the invention to obviate at least some of the above disadvantages and to provide improved methods and arrangements for decoding a signal encoded by a tail-biting code.

According to a first aspect of the invention, this is achieved by a method of decoding a signal, wherein the signal has been encoded by a tail-biting code based on at least one encoding parameter. The method is suitable for use in a communication device and comprises receiving the signal and performing a first decoding attempt of the signal based on a first set of starting state metrics and a first hypothesis regarding the at least one encoding parameter, the first decoding attempt resulting in a first set of ending state metrics. The method also comprises performing, if the first decoding attempt fails, a second decoding attempt of the signal based on a second set of starting state metrics and a second hypothesis regarding the at least one encoding parameter. The second set of starting state metrics are based on the first set of ending state metrics and the second hypothesis is different from the first hypothesis.

In some embodiments, the method may further comprise applying branch metrics in the second decoding attempt that are different from branch metrics applied in the first decoding attempt.

In some embodiments, the first hypothesis may be associated with a user and the second hypothesis may be associated with the same user.

In some embodiments, the first and second decoding attempts may be performed by using a trellis-based algorithm for decoding tail-biting codes. The trellis-based algorithm may, for example be a maximum-likelihood (ML) decoding algorithm (such as a Viterbi-based algorithm) or a maximum a posteriori (MAP) decoding algorithm.

In some embodiments, the first decoding attempt fails if a tail-biting and/or a checksum criterion is not met.

In some embodiments, the received signal may comprise downlink control information.

The at least one encoding parameter may, in some embodiments, comprise one or more of a trellis size, a quantity of aggregated encoding elements, an initial encoding element, a size of information carried by the signal, and a code rate.

In some embodiments, the signal may have been transmitted in accordance with UMTS LTE, the signal may be received over PDCCH, and the encoding elements may comprise control channel elements.

In some embodiments, the first hypothesis may presume a first initial encoding element and the second hypothesis may presume a second initial encoding element equal to the first initial encoding element.

In some embodiments, the second decoding attempt may result in a second set of ending state metrics and the method may further comprise performing, if the second decoding attempt fails, a third decoding attempt of the signal based on a third set of starting state metrics and a third hypothesis regarding the at least one encoding parameter wherein the third set of starting state metrics are based on the second set of ending state metrics.

The at least one encoding parameter may, in some embodiments, comprise at least a trellis size, a quantity of aggregated encoding elements, and an initial encoding element. The first hypothesis may presume a first trellis size, a first quantity of aggregated encoding elements, and a first initial encoding element and the second hypothesis may presume a second trellis size, a second quantity of aggregated encoding elements, and a second initial encoding element. The second trellis size may be equal to the first trellis size, the second initial encoding element may be equal to the first initial encoding element and the second quantity of aggregated encoding elements may be different from the first quantity of aggregated encoding elements.

A second aspect of the invention is a computer program product comprising a computer readable medium, having thereon a computer program comprising program instructions, the computer program being loadable into a data-processing unit and adapted to cause the data-processing unit to execute at least the steps of performing the first and second decoding attempt according to the first aspect of the invention when the computer program is run by the data-processing unit.

According to a third aspect of the invention, an arrangement is provided for decoding a signal, wherein the signal has been encoded by a tail-biting code based on at least one encoding parameter. The arrangement comprises a decoder adapted to perform a first decoding attempt of the signal based on a first set of starting state metrics and a first hypothesis regarding the at least one encoding parameter, the first decoding attempt resulting in a first set of ending state metrics. The decoder is also adapted to perform, if the first decoding attempt fails, a second decoding attempt of the signal based on a second set of starting state metrics and a second hypothesis regarding the at least one encoding parameter. The second hypothesis is different from the first hypothesis and the decoder is adapted to base the second set of starting state metrics on the first set of ending state metrics.

In some embodiments, the arrangement may further comprise a control unit associated with the decoder and adapted to control starting state metrics setting and branch metric calculation based on the first and second hypotheses.

A fourth aspect of the invention is a communication device comprising the arrangement according to the third aspect of the invention.

In some embodiments, the communication device may be a mobile terminal.

In some embodiments, the third and fourth aspects of the invention may additionally have features identical with or corresponding to any of the various features as explained above for the first aspect of the invention.

An advantage of some embodiments of the invention is that the decoding effort is reduced.

Another advantage of some embodiments of the invention is that the average number of iterations in a trellis-based algorithm, such as a wrap-around Viterbi algorithm, is reduced.

Another advantage of some embodiments of the invention is that convergence to a possible tail-biting state is enhanced in a trellis-based algorithm, such as the algorithms described in J. B. Anderson and S. M. Hladik, "A circular Viterbi algorithm for the bounded distance criterion" and in J. B. Anderson and S. M. Hladik, "Tailbiting MAP decoders".

Another advantage of some embodiments of the invention is that more control channel candidates can be tested within a given timing budget.

Another advantage of some embodiments of the invention is that successful decoding of the downlink control information is achieved faster. Thus, another advantage of some embodiments of the invention is that it is possible to start decoding of data information earlier. This may reduce the load on the decoding processor, which is another advantage of some embodiments of the invention.

Another advantage of some embodiments of the invention is that power consumption may be reduced.

BRIEF DESCRIPTION OF THE DRAWINGS

Further objects, features and advantages of the invention will appear from the following detailed description of embodiments of the invention, with reference being made to the accompanying drawings, in which:

FIG. 6 is a plot illustrating example results achieved when applying some embodiments of the invention;

FIG. 7 is a block diagram illustrating an example arrangement according to some embodiments of the invention; and FIG. 8 is a schematic drawing illustrating a mobile terminal connected, through a radio link, to a base station site, wherein the mobile terminal may comprise an arrangement according to some embodiments of the invention.

DETAILED DESCRIPTION

Figure 1:
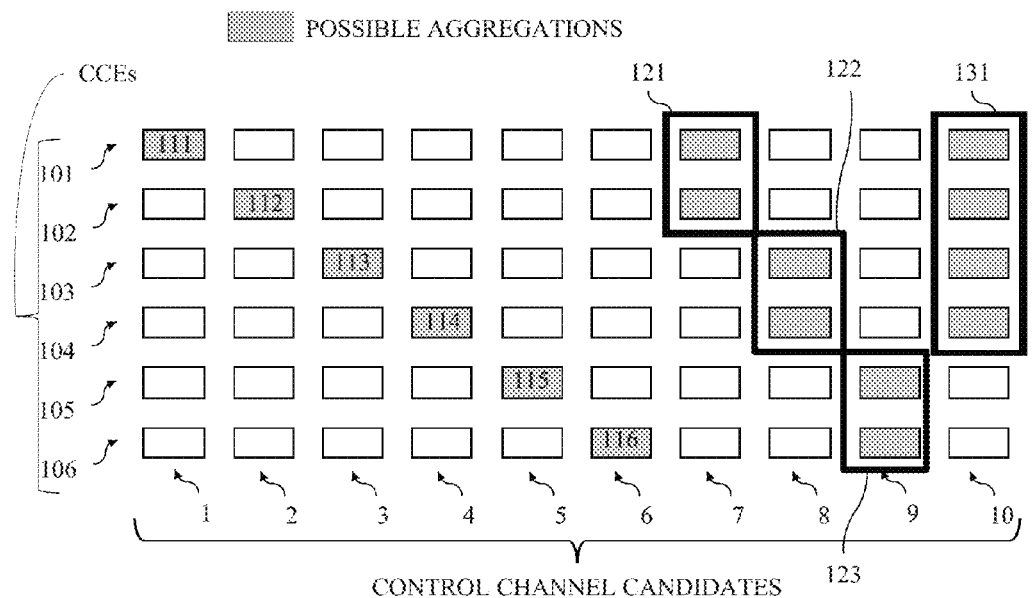
FIG. 1 is a block diagram illustrating example aggregations of control channel elements.

In the following, embodiments of the invention will be described where decoding of tail-biting is performed. In embodiments of the invention different hypotheses, e.g. regarding encoding parameters, need to be tested throughout the decoding process. In such embodiments, information achieved during a decoding attempt for a first hypothesis may be utilized in a decoding attempt for a second hypothesis. In some embodiments, the first and second hypotheses need to have a parameter value in common to be able to utilize the information from the first decoding attempt in the second decoding attempt.

The hypotheses may be associated with at least one of a trellis size, a quantity of aggregated encoding elements, an initial encoding element, a size of information carried by the signal, and a code rate. In particular embodiments, the hypotheses concern the trellis size, the quantity of aggregated encoding elements, and the initial encoding element. Then, the initial encoding element may need to coincide for the first and second hypothesis if information from the first decoding attempt is to be utilized in the second decoding attempt.

In some embodiments, the utilizing of information from earlier decoding attempts is extended to all hypotheses having a parameter value, such as the initial encoding element, in common.

In some embodiments, the information to be utilized in a further decoding attempt comprises the ending state metrics of a decoding algorithm for tail-biting codes used in the earlier decoding attempt, and these ending state metrics may be utilized as starting state metrics for the further decoding attempt. In some of these embodiments, the decoding algorithm for tail-biting codes comprises a trellis-based algorithm for tail-biting codes. The trellis-based algorithm may, for example be a maximum-likelihood (ML) decoding algorithm (such as a Viterbi-based algorithm) or a maximum a posteriori (MAP) decoding algorithm.

As mentioned before, it is proposed in UMTS LTE that the downlink control information (DCI) be encoded by a rate ⅓ tail-biting convolutional code. In the following description focus will be on the decoding of such codes in that context.

However, as will be realized by a person skilled in the art, the methods and arrangements described are equally applicable to other situations of decoding tail-biting codes (i.e. any communication standard where any information is encoded by a tail-biting code of any rate and sent in either uplink or downlink). In particular, embodiments of the invention are applicable when several hypotheses are evaluated in such decoding processes.

In the UMTS LTE example, the size of the control information may vary and may depend on the nature of the information, such as uplink (UL) scheduling grant or DL scheduling assignments, multiple-input multiple-output (MIMO) or non-MIMO mode, etc. The size of the control information may also depend on the system bandwidth. For example, the size of the control information may be between 40 and 70 bits. The control information may also include a 16-bit CRC (cyclic redundancy check) that is masked with the UE (user equipment) identity to decrease the probability of false detection. Example information that may be carried by the DCI is the transport format, the retransmission sequence number, the hybrid automatic repeat request (HARQ) process number, the number of layers, and/or pre-coding information.

Continuing the UMTS LTE example, the Physical Downlink Control CHannel (PDCCH) may carry the DCI of a single user by aggregation of a number of control channel elements (CCEs), where the number belongs to the ensemble S, s∈S. The ensemble S may, for example, be S={1, 2, 4, 8} or S={1, 2, 3, 4, 5, 6}. The chosen number s may depend on the rate with which the encoded information is to be transmitted.

The aggregated CCEs may be chosen from a number of CCEs, $N_{CCE}$, available for aggregation. The CCEs available for aggregation may or may not differ between different sub-frames. Similarly, the number of CCEs available for aggregation may or may not differ between different sub-frames. There may or may not be a relation between the respective number (and identity) of CCEs available for aggregation for different sub-frames. How many REs/CCEs that are available to a particular user equipment (UE) may be determined by higher layer processing.

Each CCE may consist of a number, X, of resource elements (RE). The REs may comprise QPSK (Quadrature Phase Shift Keying) symbols. The number X may be bandwidth-dependent.

Since one or more of the encoding parameters, such as the number s of aggregated CCEs and the identity of the aggregated CCEs, may not be known to the decoder, one problem for a decoder (for example residing in a UE) may be that a large number of blind detection attempts have to be performed.

FIG. 1 illustrates example aggregations of control channel elements where $N_{CCE}$=6 and CCEs 101-106 are available for aggregation. If, for example, aggregated control channel candidates of size s∈S={1, 2, 4, 8} are only allowed to start at positions modulo s, then the possible aggregations are as demonstrated at 111-116, 121-123, and 131. These aggregations each correspond to possible control channel candidates 1-10. In this example, the largest number of control channels that have to be tested is $\Sigma_{s\in S}\lfloor N_{CCE}/s\rfloor$=10.

Figure 2:
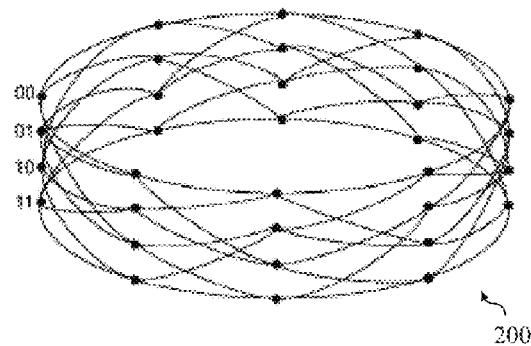
FIG. 2 is a diagram illustrating an example trellis for a tail-biting code.

FIG. 2 illustrates an example trellis 200 used to describe the codewords of a tail-biting code. The length (i.e. the circumference) of the trellis may be denoted by K. The length of the example trellis 200 is K=8 and the encoder memory is m=2.

When using a trellis, such as trellis 200, for evaluating a number of hypothesized CCEs (or REs) based on received signal values, the length K of the trellis is implicitly determined by the code rate R (R=K/N, where N is the number of encoded bits in a trellis). The length may in turn be a function of the assignment, and the size of the assignment may be a function of the bandwidth.

With the possible CCE aggregations defined as in the described UMTS LTE example and a given K, the possible code rates of the DCI are given by R=K/(2×S), where the "2" is due to that each RE comprises a QPSK-symbol. These possible code rates may in turn determine a mapping of the received signal values along the trellis branches.

A specific decoding assignment, e.g. looking for a payload corresponding to MIMO DL, may have a specific, predetermined K. The different hypotheses associated with the decoding assignment may presume different number of encoded bits N (or equivalently, different number of CCEs). Thus, for this situation, the same trellis of length K is used throughout the entire evaluation associated with the decoding assignment, while the number of encoded bits associated with each branch of the trellis may differ between hypotheses. This may be achieved e.g. by puncturing the tail-biting code as part of the encoding process. This rate-matching procedure may enable construction of a code having any code rate less than one. In the encoding process, K information bits are input to the encoder. These information bits represent the DCI to be conveyed. Then, $K/R_{TB}$ (where $R_{TB}$ is the code rate of the tail-biting code) encoded bits are output from the tail-biting encoder and exposed to the rate-matching process. In this process the $K/R_{TB}$ bits may be punctured to achieve a code rate of between $R_{TB}$ and 1. To achieve a code rate lower than $R_{TB}$, one or more of the encoded bits may be repeated once or more. The encoded bits thus chosen in the rate-matching process are mapped to the REs. These REs correspond to a number of CCEs as explained above. The REs may be interleaved before transmission.

Continuing the UMTS LTE example and assuming a given bandwidth, there are a number $N_K$ of possible trellis lengths K to for the hypotheses. The different trellis lengths may be due to that there are several defined assignments, e.g., for uplink or downlink scheduling. Thus, the number of hypotheses to be tested corresponds to $N_K\Sigma_{s\in S}\lfloor N_{CCE}/s\rfloor$.

Thus, it is clear that a search for control channel information in UMTS LTE could be very computing-extensive, due to the large number of hypotheses to be tested and also to that each decoding attempt may in itself be computing-extensive. This may have impact on the overall power consumption and hardware design. This together with timing budget and energy efficiency may impose an upper limit on the number of candidates (hypotheses) that it is possible to test. In UMTS LTE, for example, a restriction may be applied to the payload space, which may provide an upper limit on $N_{CCE}$, and in turn on the number of hypotheses. Making each decoding attempt more efficient by applying embodiments of the invention may relax the timing budget.

Hence, it may be desirable to reduce the computing effort needed for each hypothesis test and also the computing effort needed for going through the different hypothesis tests.

One possible way to obtain this is to utilize estimations from one or more previous decoding attempts (each relating to a hypothesis) in a current decoding attempt. This is possible at least if the previous estimates apply to the same encoding process. The previous estimates applying to the same encoding process albeit with a different code rate is no obstacle in practicing this approach. Practicing this approach may result in that the average decoding effort for a hypothesis test decreases. For example, an average number per decoding attempt of iterations of a decoding algorithm may be lowered.

There are several decoding algorithms suitable for decoding of a tail-biting code. Each such decoding algorithm may be applied to a hypothesis-testing decoding attempt.

For example, the wrap-around Viterbi algorithm (WAVA) (further described in R. Y. Shao, S. Lin and M. P. Fossorier, "Two decoding algorithms for tail-biting codes" as referenced above) gives close to maximum likelihood (ML) performance at relatively low implementation complexity. The following description will use WAVA as an illustrative example. However, it is noted that embodiments of the invention may successfully use any other decoding algorithm suitable for decoding of tail-biting codes. Examples of such other decoding algorithm can also be found in J. B. Anderson and S. M. Hladik, "A circular Viterbi algorithm for the bounded distance criterion" and J. B. Anderson and S. M. Hladik, "Tailbiting MAP decoders" as referenced above.

Figure 3:
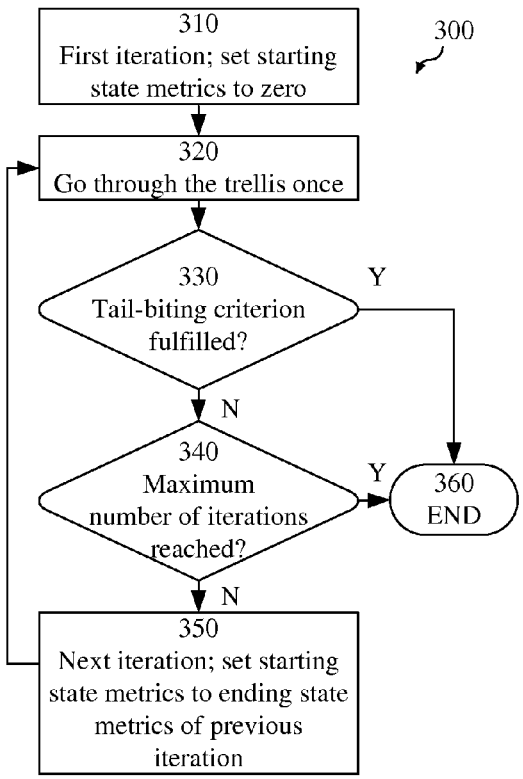
FIG. 3 is a flowchart illustrating example method steps of a trellis-based algorithm according to some embodiments of the invention.

FIG. 3 illustrates an example method 300 according to a decoding algorithm suitable for decoding of tail-biting codes, such as the wrap-around Viterbi algorithm. The figure will be described in terms of WAVA, but is equally descriptive of other iterative decoding algorithms suitable for decoding of tail-biting codes, using a trellis-evaluating method (such as a Viterbi-based algorithm) and tail-biting criterion checking.

Briefly, WAVA is a standard Viterbi algorithm, except that all starting state metrics $\Gamma_1^1$ are initialized to zero (or another pre-determined number) at the beginning of the first iteration (sub-script denotes the trellis step and superscript denotes the iteration number), step 310. This is because the starting state is unknown in contrast to the standard Viterbi algorithm, where the starting state is known and hence only one of the starting state metrics is initiated to a number that labels this state as a starting state (and the other ones to a number that labels these states as impossible starting states). When the first iteration has been performed in step 320 (i.e. after K steps in the trellis) a test of the tail-biting criterion is made in step 330 (i.e. it is determined if the path with the best metric (the ML path) has the same stating and ending state). If the tail-biting criterion is met, the decoding is interrupted and the ML path is output from the decoder as a successful result in step 360. If the tail-biting criterion is not met, and a maximum number of iterations $IT_{max}$ have not been performed (step 340) the decoding continues in steps 350 and 320 with another iteration with the state metrics from the earlier iteration, i.e. $\Gamma_1^2 = \Gamma_K^1$. At the end of each following iteration the tail-biting criterion is tested in step 330 and decoding is interrupted if the criterion is met and the ML path is output from the decoder as a successful result in step 360. The procedure continues until either the tail-biting criterion is met or a maximum number of iterations $IT_{max}$ has been performed (or the tail-biting criterion is met and the maximum number of iterations have been performed). If the maximum number of iterations has been performed and the tail-biting criterion has not been met, the decoding is interrupted in step 340 and a decoding failed result is output in step 360 (possibly along with the ML path found).

In alternative embodiments of the invention, other decoding algorithms may be used that do not involve a tail-biting criterion check (such as the circular Viterbi algorithm by Anderson and Hladik as referenced above). Such other decoding algorithms may process the trellis circularly with a pre-defined number of stages larger than K. After this pre-defined number of stages, the decoded sequence is output.

It is to be noted that "failed" in this context is not only to be interpreted as the output path being incorrect. If, for example, a cyclic redundancy check is to be performed after the tail-biting decoding, this may still check. In this context, "failed" means rather that the tail-biting criterion is not met. However, in other embodiments of the invention "failed" may denote unsuccessful in any other way derivable by the skilled person, such as an output path being incorrect (i.e. not corresponding to the transmitted sequence), a CRC not checking, the algorithm not being able to find an appropriate (i.e. ML or MAP—maximum a posteriori) output path, etc.

As an example, it may be assumed that the UE is hypothesizing a specific payload (i.e. trellis length) K and a specific CCE aggregation (e.g. 111 of FIG. 1, i.e. CCE 101 corresponding to control channel 1). Then, if the received signal cannot be decoded with this hypothesis in $IT_{max}$ iterations, one possible way forward may be to continue with another hypothesis with an overlapping CCE aggregation (e.g. 121 of FIG. 1, i.e. CCEs 101-102 corresponding to control channel 7). In this context, overlapping CCE aggregation means that the initial CCE is the same for both control channels (here CCE 101). If the received signal cannot be decoded with this hypothesis in $IT_{max}$ iterations, then another overlapping CCE aggregation (e.g. 131 of FIG. 1, i.e. CCEs 101-104 corresponding to control channel 10) may be hypothesized.

In the second and third hypotheses, the same encoding process has already been observed in the decoding trial of the first hypothesis, albeit at a higher code rate. One way to benefit from information gained in the previous decoding attempts (relating to a previous hypothesis) may be to initialize the starting state metrics of the decoder with the ending state metrics from a previous decoding attempt.

With reference to FIG. 3, this would correspond to that the decoding attempt for the third hypothesis is initialized as $\Gamma_1^1(3) = \Gamma_K^{IT\ max}(2)$, where the number within parentheses indicates the hypothesis. Effectively, this may be equivalent to that the decoder will not start in iteration one for hypothesis 3, but in iteration n, where $1 < n < IT_{max}$. Thus, convergence to a tail-biting codeword may be achieved in fewer iterations on average.

Due to the different channel disturbance while transmitting the additional symbols (of e.g. CCE 102 for aggregation 121 and CCE 103 and 104 for aggregation 131), there are now more than one different received versions of the same encoded trellis, effectively lowering the code rate by increasing redundancy/diversity. Going from an aggregation with fewer CCEs to an aggregation with more CCEs is, in fact, equivalent to lowering the code rate of the hypothesis. Thus, for each trellis stage, there are more encoded symbols than in the earlier hypothesis and the branch metrics must be adjusted accordingly. The new branch metrics for a new hypothesis are derived by properly super-positioning the received values that belong to the same positions in the trellis stages.

Assuming, as an example, a rate ⅓ tail-biting code and that the first hypothesis assumed 2 soft bits (a=a1, b=b1) per trellis stage (and that the third bit had been punctured), then the second hypothesis may assume 3 soft bits per stage ({a, b, c}={a2, b2, c2}, where a2=a1 and b2=b1), and the third hypothesis may assume 6 soft bits per stage ({a, b, c, d, e, f,}={a3, b3, c3, d3, e3, f3}, where {a3, b3, c3}={a2, b2, c2} and {d3, e3, f3} are soft values corresponding to repeated encoded bits). For the three hypotheses, the branch metrics are calculated based on {a}, {a, b, c} and {a+d, b+e, c+f} respectively.

Figure 4:
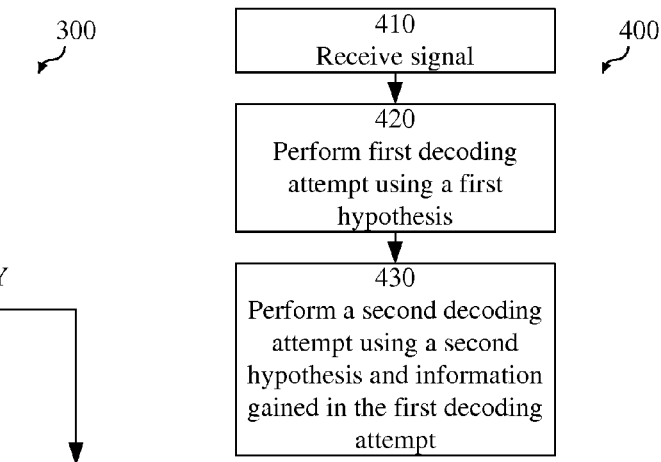
FIG. 4 is a flowchart illustrating example method steps according to some embodiments of the invention.

FIG. 4 illustrates an example method 400 according to some embodiments of the invention. In step 410, a signal is received, which has been encoded by a tail-biting code having certain parameters. In step 420 a first decoding attempt is made under a first hypothesis regarding one or more of the parameters. The decoding algorithm used may, for example, be the WAVA as described in connection to FIG. 3. If the first decoding attempt fails, a second decoding attempt is made in step 430 under a second hypothesis regarding one or more of the parameters. The second decoding attempt uses knowledge gained in the first decoding attempt.

Figure 5:
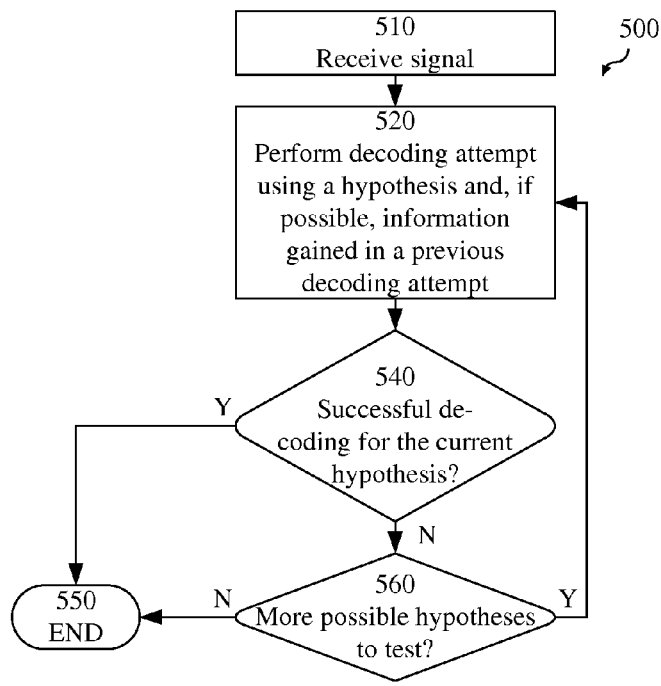
FIG. 5 is a flowchart illustrating example method steps according to some embodiments of the invention.

FIG. 5 illustrates another example method 500 according to some embodiments of the invention. In step 510, a signal is received, which has been encoded by a tail-biting code having certain parameters. In step 520 a first decoding attempt is made under a first hypothesis regarding one or more of the parameters. The decoding algorithm used may, for example, be the WAVA as described in connection to FIG. 3. If the first decoding attempt is successful (YES—path out of step 540) then the decoding process is complete and outputs the decoded result in step 550. If the first decoding attempt fails (NO-path out of step 540) then the process continues to step 560, where it is determined if there are any more hypotheses to test. If there are no more hypotheses (NO—path out of step 560) the decoding process is ended and outputs a decoding failed indication in step 550. If there are more hypotheses (YES—path out of step 560) the decoding process returns to step 520, where a new decoding attempt is made under a new hypothesis regarding one or more of the parameters. The new decoding attempt may use knowledge gained in the first decoding attempt if a certain parameter, such as the initial CCE of the hypothesized aggregations, coincides with a previously used hypothesis.

If the hypotheses associated with the same initial CCE are evaluated subsequently, then embodiments of the invention may be implemented at no additional cost. When starting a decoding attempt of a hypothesized CCE-aggregation having the same initial CCE as the previously hypothesized CCE-aggregation, one approach according to these embodiments is to omit clearing the state metric memory to benefit from the knowledge gained in the previous decoding attempt. Similarly, when starting a decoding attempt of a hypothesized CCE-aggregation that is suspected to belong to the same control channel as the previously hypothesized CCE-aggregation, clearing the state metric memory may be omitted to benefit from the knowledge gained in the previous decoding attempt.

FIG. 6 is a plot illustrating example results achieved when applying some embodiments of the invention. A simulation was carried out with aggregation levels S={2, 3, 4} (yielding code rates R=0.75, 0.5 and 0.37, respectively). $IT_{max}$ was set to 2, the channel was simulated as an additive white Gaussian noise (AWGN) channel, the target BLER (block error rate) was set to 0.01, the payload K=72, and X=24.

In this simulation, no noticeable difference in the achieved BLER was seen between standard WAVA and the WAVA extension according to embodiments of the invention. However, using the WAVA extension according to embodiments of the invention, the BLER was achieved with fewer iterations on average.

The number of occurrences when one iteration is sufficient in the 3-CCE-aggregation trial (after the 2-CCE aggregation trial failed after $IT_{max}$ iterations) is depicted at 601 for the WAVA extension according to embodiments of the invention and at 602 for the standard WAVA. The number of occurrences when two iterations need to be carried out in the 3-CCE-aggregation trial is depicted at 603 for the WAVA extension according to embodiments of the invention and at 604 for the standard WAVA. Similarly, The number of occurrences when one iteration is sufficient in the 4-CCE-aggregation trial (after the 2-CCE and 3-CCE aggregation trials failed after $IT_{max}$ iterations each) is depicted at 605 for the WAVA extension according to embodiments of the invention and at 606 for the standard WAVA and the number of occurrences when two iterations need to be carried out is depicted at 607 for the WAVA extension according to embodiments of the invention and at 608 for the standard WAVA.

It can be seen that the WAVA extension according to embodiments of the invention more often only requires one iteration instead of two, thus lowering the overall average decoding time.

FIG. 7 illustrates an arrangement 700 according to some embodiments of the invention. The arrangement 700 may, for example, be adapted to perform some or all of the method steps as described in connection to FIGS. 3-5.

The example arrangement 700 comprises one or more receive antennas 705 and a receiver chain 710. A signal received through the receive antennas 705 is processed (e.g. filtered, down-converted, etc.) in receiver front-end circuitry 720. Further the thus processed signal may be subject to other signal processing steps in processing circuitry 730 as derivable by the skilled person. In some embodiments, e.g. if the received signal is an Orthogonal Frequency Division Multiplex (OFDM) signal as in UMTS LTE, the processing circuitry 730 may comprise an FFT (fast Fourier transform) unit, a channel estimator, an equalizer, etc. In other embodiments, the processing circuitry 730 may comprise alternative or additional components commonly used in receiver chains.

The arrangement 700 is adapted to receive a signal encoded by a tail-biting code by one or more antennas and to process the received signal according to any methods commonly applied in receiver chains.

The receiver chain 710 further comprises a decoder 740, suitable to decode a signal encoded by a tail-biting code. The decoder 740 may be associated with a control unit 750, which may be integral or external to the decoder 740. The decoder 740 may, for example, be adapted to perform method steps as described in connection to FIGS. 3-5, and the control unit 750 may be adapted to control at least part of such decoder operation.

FIG. 8 illustrates an example mobile terminal 810 connected, through a radio link 820, to a base station site 830. The base station site 830 comprises one or more antennas 835 and at least one base station 850. The mobile terminal 810 may comprise an arrangement for decoding a signal, wherein the signal has been encoded by a tail-biting code according to embodiments of the invention. The mobile terminal 810 may, for example, comprise an arrangement as described in connection to FIG. 7.

The mobile terminal 810 is illustrated as a mobile telephone in a schematic front view. This example mobile terminal 810 comprises an antenna mounted on the housing of the apparatus. Alternatively, the mobile terminal 810 may have an internal antenna mounted within the housing of the apparatus. The mobile terminal 810 may even comprise multiple antennas. The mobile terminal 810 may further comprise a display, a keypad, a loudspeaker, and a microphone, which together provides a man-machine interface for operating the mobile terminal 810.

The example mobile terminal 810 is adapted to connect to a mobile telecommunication network via the wireless link 820 to the radio base station 850. Hence, a user of the mobile terminal 810 may use conventional circuit-switched telecommunication services such as voice calls, data calls, video calls, and fax transmissions, and/or packet-based services such as electronic messaging, VoIP, Internet browsing, electronic commerce, etc. To this end, the mobile terminal 810 and the base station 850 may be compliant with at least one mobile telecommunication standard, for instance UMTS LTE.

The described embodiments of the invention and their equivalents may be realised in software or hardware or a combination thereof. They may be performed by general-purpose circuits associated with or integral to a communication device, such as digital signal processors (DSP), central processing units (CPU), co-processor units, field-programmable gate arrays (FPGA) or other programmable hardware, or by specialized circuits such as for example application-specific integrated circuits (ASIC). All such forms are contemplated to be within the scope of the invention.

The invention may be embodied within an electronic apparatus comprising circuitry/logic or performing methods according to any of the embodiments of the invention. The electronic apparatus may, for example, be a portable or handheld mobile radio communication equipment, a mobile radio terminal, a mobile telephone, a base station, a pager, a communicator, an electronic organizer, a smartphone, a computer, a notebook, a USB-stick, a plug-in card, an embedded drive, a mobile gaming device, or a (wrist) watch.

According to some embodiments of the invention, a computer program product comprises a computer readable medium such as, for example, a diskette or a CD-ROM. The computer readable medium may have stored thereon a computer program comprising program instructions. The computer program may be loadable into a data-processing unit, which may, for example, be comprised in a mobile terminal. When loaded into the data-processing unit, the computer program may be stored in a memory associated with or integral to the data-processing unit. According to some embodiments, the computer program may, when loaded into and run by the data-processing unit, cause the data-processing unit to execute method steps according to, for example, the methods shown in any of the FIGS. 3-5.

The invention has been described herein with reference to various embodiments. However, a person skilled in the art would recognize numerous variations to the described embodiments that would still fall within the scope of the invention. For example, the method embodiments described herein describes example methods through method steps being performed in a certain order. However, it is recognized that these sequences of events may take place in another order without departing from the scope of the invention. Furthermore, some method steps may be performed in parallel even though they have been described as being performed in sequence.

In the same manner, it should be noted that in the description of embodiments of the invention, the partition of functional blocks into particular units is by no means limiting to the invention. Contrarily, these partitions are merely examples. Functional blocks described herein as one unit may be split into two or more units. In the same manner, functional blocks that are described herein as being implemented as two or more units may be implemented as a single unit without departing from the scope of the invention.

Hence, it should be understood that the limitations of the described embodiments are merely for illustrative purpose and by no means limiting. Instead, the scope of the invention is defined by the appended claims rather than by the description, and all variations that fall within the range of the claims are intended to be embraced therein.

The invention claimed is:

1. A method in a communication device for decoding a signal that has been encoded by a tail-biting code based on at least one encoding parameter, the method comprising:
   receiving the signal;
   performing a first decoding attempt of the signal based on a first set of starting state metrics and a first hypothesis regarding the at least one encoding parameter, the first decoding attempt resulting in a first set of ending state metrics, wherein the first set of starting state metrics is different than the first hypothesis; and
   performing, if the first decoding attempt fails, a second decoding attempt of the signal based on a second set of starting state metrics and a second hypothesis regarding the at least one encoding parameter; wherein the second set of starting state metrics is based on the first set of ending state metrics, the second hypothesis is different from the first hypothesis, the second set of starting state metrics is different from the second hypothesis, and the at least one encoding parameter comprises one or more of a trellis size, a quantity of aggregated encoding elements, and a code rate;
   wherein;
   the at least one encoding parameter comprises at least a trellis size, a quantity of aggregated encoding elements, and an initial encoding element;
   the first hypothesis presumes a first trellis size, a first quantity of aggregated encoding elements, and a first initial encoding element; and
   the second hypothesis presumes a second trellis size, a second quantity of aggregated encoding elements, and a second initial encoding element, the second trellis size being equal to the first trellis size, the second initial encoding element being equal to the first initial encoding element and the second quantity of aggregated encoding elements being different from the first quantity of aggregated encoding elements.

2. An arrangement for decoding a signal that has been encoded by a tail-biting code based on at least one encoding parameter, the arrangement comprising a decoder adapted to:
   perform a first decoding attempt of the signal based on a first set of starting state metrics and a first hypothesis regarding the at least one encoding parameter, the first decoding attempt resulting in a first set of ending state metrics, wherein the first set of starting state metrics is different than the first hypothesis; and
   perform, if the first decoding attempt fails, a second decoding attempt of the signal based on a second set of starting state metrics and a second hypothesis regarding the at least one encoding parameter; wherein the second hypothesis is different from the first hypothesis, the second set of starting state metrics is based on the first set of ending state metrics, the second set of starting state metrics is different from the second hypothesis, and the at least one encoding parameter comprises one or more of a trellis size, a quantity of aggregated encoding elements, and a code rate;

wherein the decoder is adapted to perform the first and second decoding attempts by using a trellis-based algorithm for decoding tail-biting codes;

wherein;
- the at least one encoding parameter comprises at least a trellis size, a quantity of aggregated encoding elements, and an initial encoding element;
- the first hypothesis presumes a first trellis size, a first quantity of aggregated encoding elements, and a first initial encoding element;
- the second hypothesis presumes a second trellis size, a second quantity of aggregated encoding elements, and a second initial encoding element; and
- the control unit is further adapted to set the second set of starting state metrics equal to the first set of ending state metrics if the second trellis size is equal to the first trellis size and the second initial encoding element is equal to the first initial encoding element.

* * * * *